(12) United States Patent
Wu

(10) Patent No.: US 6,551,877 B1
(45) Date of Patent: Apr. 22, 2003

(54) METHOD OF MANUFACTURING MEMORY DEVICE

(75) Inventor: Kun-Jung Wu, Hsinchu (TW)

(73) Assignee: Powerchip Semiconductor Corp., Shinchu (TW)

( * ) Notice: Subject to any disclaimer, the term of this patent is extended or adjusted under 35 U.S.C. 154(b) by 0 days.

(21) Appl. No.: 10/064,092

(22) Filed: Jun. 11, 2002

(51) Int. Cl.[7] .......................................... H01L 21/8242
(52) U.S. Cl. ........................ 438/256; 438/399; 438/597; 438/618; 438/621; 438/626
(58) Field of Search ................................ 438/239, 241, 438/250, 253, 256, 393, 396, 399, 571, 597, 618, 621, 626, 629, 631, 633, 634, 637, 645, 647, 657, 675

(56) References Cited

U.S. PATENT DOCUMENTS 6,204,161 B1 * 3/2001 Chung et al. ............... 438/612
6,403,996 B1 * 6/2002 Lee ............................ 257/256
6,406,971 B1 * 6/2002 Chien et al. ................ 438/398

* cited by examiner

Primary Examiner—Carl Whitehead, Jr.
Assistant Examiner—Jack Chen
(74) Attorney, Agent, or Firm—Jiano Chyun Intellectual Property Office

(57) ABSTRACT

A method of manufacturing a memory device. A substrate having an active region, a plurality of gate structures and a plurality of source/drain regions are provided. An inter-layer dielectric layer is formed over the substrate. A global opening that exposes the source/drain regions for forming contacts and the gate structures inside the active region is formed in the inter-layer dielectric layer. A conductive layer that completely fills the global opening is formed over the substrate. A portion of the conductive layer and the inter-layer dielectric layer is removed to expose the upper surface of the gate structures, thereby forming a plurality of contacts between the gate structures.

16 Claims, 5 Drawing Sheets

METHOD OF MANUFACTURING MEMORY DEVICE

BACKGROUND OF THE INVENTION

1. Field of Invention

The present invention relates to a method of manufacturing semiconductor devices. More particularly, the present invention relates to a method of manufacturing memory devices.

2. Description of Related Art

Memory is an important semiconductor device for holding data or programs. As computer microprocessors becomes more powerful and programming software increases in size and complexity, demands for memory storage area also increase proportionately. To produce large capacity memory units at a cheaper cost, all semiconductor manufacturers are striving to increase the level of integration of devices.

For example, dynamic random access memory (DRAM) is a common type of memory device because DRAM has a high level of integration, a good read/write capability and a relatively low production cost.

Basic structure of a memory cell inside the DRAM includes a metal-oxide-semiconductor (MOS) device and a capacitor. One source/drain region of a MOS device is electrically connected to a bit line while the other source/drain region of the MOS device is electrically connected to a capacitor. Data is stored as charges in the capacitor of the DRAM cell. However, as the level of integration increases, dimensions of each memory cell and area occupation of the associated capacitor must be reduced. To maintain a relatively constant capacitance value, the capacitor usually has a capacitor over bit line (COB) design. This design has a bigger cross-sectional area at the bottom of the capacitor so that overall surface area of the capacitor is increased.

In DRAM, the fabrication of dielectric layer, the formation of contacts and the laying of metallic interconnecting wires after the formation of MOS device over a substrate are all important manufacturing steps. For DRAM having a COB design, two or more layers of conductive layers are used to match up with the increased connections necessary to link up increased number of devices after miniaturization. Although a multiple conductive layer design is able to resolve interconnection problems caused by an increase in level of integration, an increase in device thickness leads to the contact opening having a larger aspect ratio. Ultimately, the alignment and etching window for fabricating the contact openings is correspondingly reduced. To minimize alignment and etching problems, a self-aligned contact (SAC) process is now commonly used to form the necessary connections between the substrate and the metallic wires.

A conventional self-aligned contact process includes forming a plurality of gate structures over a substrate and sequentially forming a silicon nitride liner layer and an inter-layer dielectric layer over the substrate. Thereafter, a portion of the inter-layer dielectric layer is removed to form a plurality of openings above the source/drain regions. The exposed liner layer is removed to form bit line contact openings and storage node contact openings. Conductive material is deposited into the bit line contact openings and the storage node contact openings to form bit line contacts (or landing pads) and storage node contacts (or storage node landing pads).

However, as the level of integration for semiconductor devices continues to increase, the conventional DRAM contact manufacturing process has the following problems. Since the bit line contact openings and the storage node openings are separate from each other and have different opening dimensions (size of the bit line contact opening is greater than the storage node contact opening), etching rate between the bit line contact openings and the storage node contact openings are different (etching rate of the bit line contact openings is higher than the storage node contact openings). Hence, in the process of etching the inter-layer dielectric layer to form the contact openings, the substrate of larger contact openings is exposed much sooner than the smaller contact openings. In other words, the contact openings having a smaller dimension are still covered by a residual inter-layer dielectric layer when all of the inter-dielectric layer covering the larger contact openings have been removed. To ensure that the interior of each contact opening is free of any inter-layer dielectric material, the etching period is extended. However, an extension of the etching time may lead to an over-etching of substrate, gate cap and spacers inside larger size contact openings. Ultimately, the damaged substrate or the subsequently formed bit line contacts or the storage node contacts may form a short circuit with the gate.

Furthermore, dimensions of contact opening also reduce due to a tightening of design rules. Consequently, the problem of overlapping openings is increasingly severe leading to greater difficulties in performing the self-aligned contact etching process.

SUMMARY OF THE INVENTION

Accordingly, one object of the present invention is to provide a method of manufacturing a memory device capable of increasing performance stability and reducing production cost.

A second object of this invention is to provide a method of manufacturing a memory device capable of forming precise self-aligned contact openings without damaging surrounding gate cap layer or spacers and preventing the gate electrode from forming a short circuit with a subsequently formed contact.

To achieve these and other advantages and in accordance with the purpose of the invention, as embodied and broadly described herein, the invention provides a method of manufacturing a memory device. A substrate having a plurality of active regions, a plurality of gate structures and a plurality of source/drain regions thereon is provided. An inter-layer dielectric layer is formed over the substrate. A global opening is formed inside the inter-layer dielectric layer. The global opening at least exposes the active regions for forming a plurality of contacts above the source/drain regions and the gate structures between them. A conductive layer filling the global opening is formed over the substrate. A portion of the conductive layer and the inter-layer dielectric layer is removed until the upper surface of the gate cap layer is exposed to form the plurality of contacts that connect with the source/drain regions electrically.

In this invention, a global opening is formed inside the inter-layer dielectric layer. The global opening exposes the source/drain regions for forming contacts and the associated gate structures between the source/drain regions inside the active region. Thereafter, conductive material is deposited into the global opening and any excess conductive material above the gate structure, the inter-layer dielectric layer and the liner layer is removed until the upper surface of the gate cap layer is exposed. Ultimately, a plurality of disconnected contacts is formed. Since there is no need to form openings that separately expose the source region and the drain region in the inter-layer dielectric layer, performance stability and processing window for the semiconductor devices is improved and production cost is lowered. Furthermore, precise and reliable self-aligned contact openings are formed without any damages to the gate cap layer or the spacers. Consequently, short circuit between the gate and subsequently formed bit line contact or storage node contact is prevented.

In addition, a liner layer may form over the substrate before the inter-layer dielectric layer. This liner layer is made from a material having an etching rate that differs from the inter-layer dielectric layer. Hence, the liner layer may serve as an etching stop layer when the inter-layer dielectric layer is etched to from the global opening. The liner layer may further serve as a protective layer protecting the substrate or the gate structure against any damages due to etching. The exposed liner layer inside the global opening may be removed subsequently.

This invention also provides an alternative method of forming a dynamic random access memory. A substrate having an active region thereon is provided. The active region further includes a plurality of gate structures and a plurality of source/drain regions. An inter-layer dielectric layer is formed over the substrate. The dielectric layer is patterned to form a global opening that exposes the source/drain regions for forming a first contact and a second contact as well as the gate structure between the source/drain regions inside the active region. Thereafter, conductive material is deposited over the substrate to fill the global opening. A portion of the conductive layer and the inter-layer dielectric layer are removed to form the first contact and the second contact. A bit line electrically connected to the first contact and a capacitor electrically connected to the second contact are sequentially formed over the substrate.

In the process of fabricating a DRAM according to this invention, a global opening is directly formed inside the inter-layer dielectric layer. The global opening at least exposes the source/drain regions for forming the bit line contact and the storage node contact and associated gate structure between the source/drain regions inside the active region. This is followed by depositing conductive material to fill the global opening. Excess conductive material above the gate structure and a portion of the inter-layer dielectric layer are removed to expose the upper surface of the gate cap layer. Consequently, bit line contacts (landing pad) and the storage node contacts (landing pad) are formed. Since there is no need to form openings that separately expose the source region and the drain region in the inter-layer dielectric layer, performance stability and processing window for the semiconductor devices is improved and production cost is lowered. Furthermore, precise and reliable self-aligned contact openings are formed without any damage to the gate cap layer or the spacers. Consequently, short circuit between the gate and subsequently formed bit line contact or storage node contact is prevented.

In addition, a liner layer may form over the substrate before the inter-layer dielectric layer. This liner layer is made from a material having an etching rate that differs from the inter-layer dielectric layer. Hence, the liner layer may serve as an etching stop layer when the inter-layer dielectric layer is etched to form the global opening. The liner layer may further serve as a protective layer protecting the substrate or the gate structure against any damage due to etching. The exposed liner layer inside the global opening may be removed subsequently.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1A:
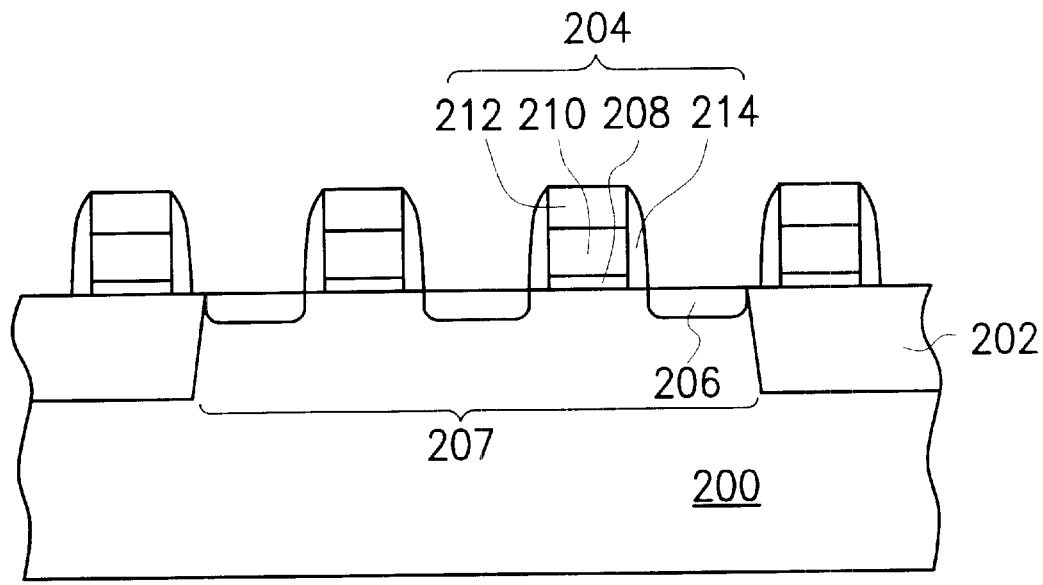
FIGS. 1A through 1E are a series of cross-sectional views showing the progression of steps for forming a dynamic random access memory according to one preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1E are a series of cross-sectional views showing the progression of steps for forming a dynamic random access memory according to one preferred embodiment of this invention. FIGS. 2A to 2D are a series of top views showing the progression of steps for forming a dynamic random access memory according to this invention. In fact, FIGS. 1A to 1D are cross-sectional views along line I—I of FIGS. 2A to 2D respectively.

Figure 2A:
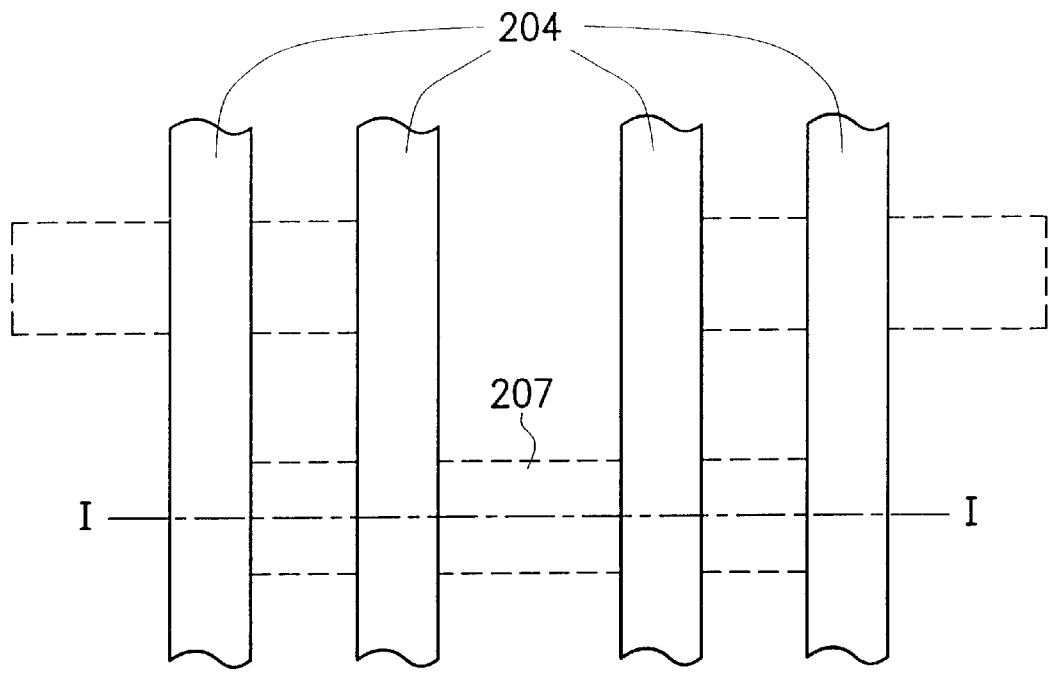
FIGS. 2A to 2D are a series of top views showing the progression of steps for forming a dynamic random access memory according to this invention.

As shown in FIGS. 1A and 2A, a substrate 200 is provided. An isolation structure 202, gate structures 204, and source/drain regions 206 are sequentially formed on the substrate 200. The isolation structure 202 marks out an active region 207 from surrounding non-active region. The isolation structure 202 is formed, for example, by local oxidation of silicon (LOCOS) or shallow trench isolation. The gate structure 204 is a composite structure comprising, for example, a gate dielectric layer 208, a gate conductive layer (a word line) 210, a gate cap layer 212 and spacers 214. The gate dielectric layer 208, for example, is a silicon oxide layer formed by thermal oxidation. The gate conductive layer 210, for example, is a polysilicon layer formed by chemical vapor deposition. The gate cap layer 212, for example, is a silicon nitride, silicon oxide or silicon oxynitride layer formed by chemical vapor deposition. The spacers 214 are silicon nitride, silicon oxide or silicon oxynitride layer, for example. The spacers 214 are formed, for example, by depositing insulating material in a chemical vapor deposition and removing a portion of the insulation layer in an anisotropic etching process.

Figure 1B:
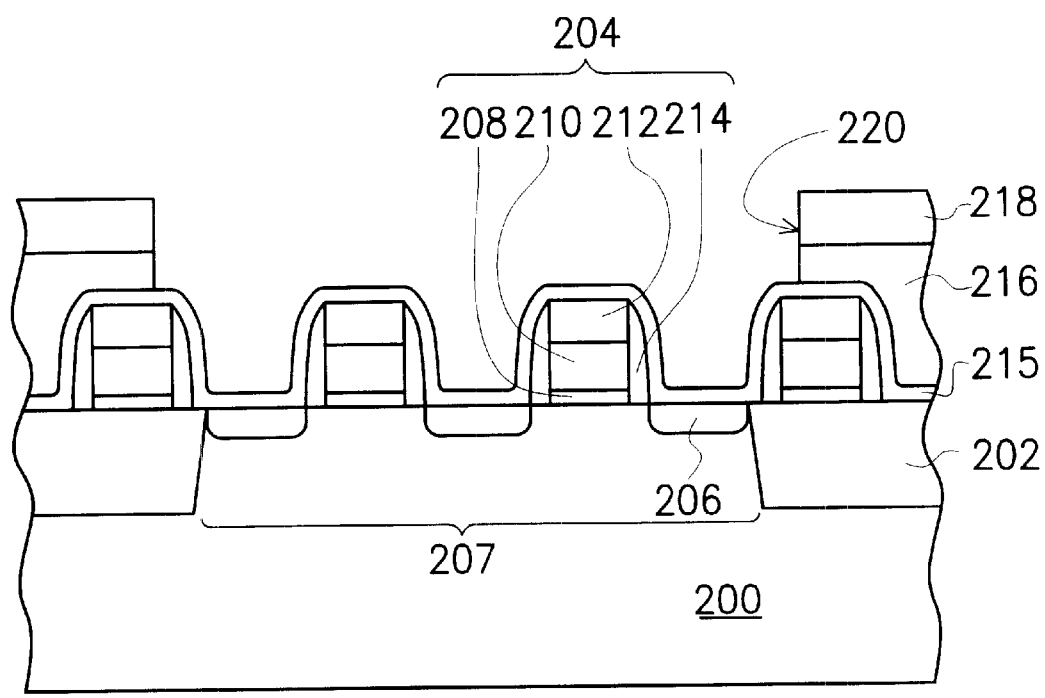
Figure 2B:
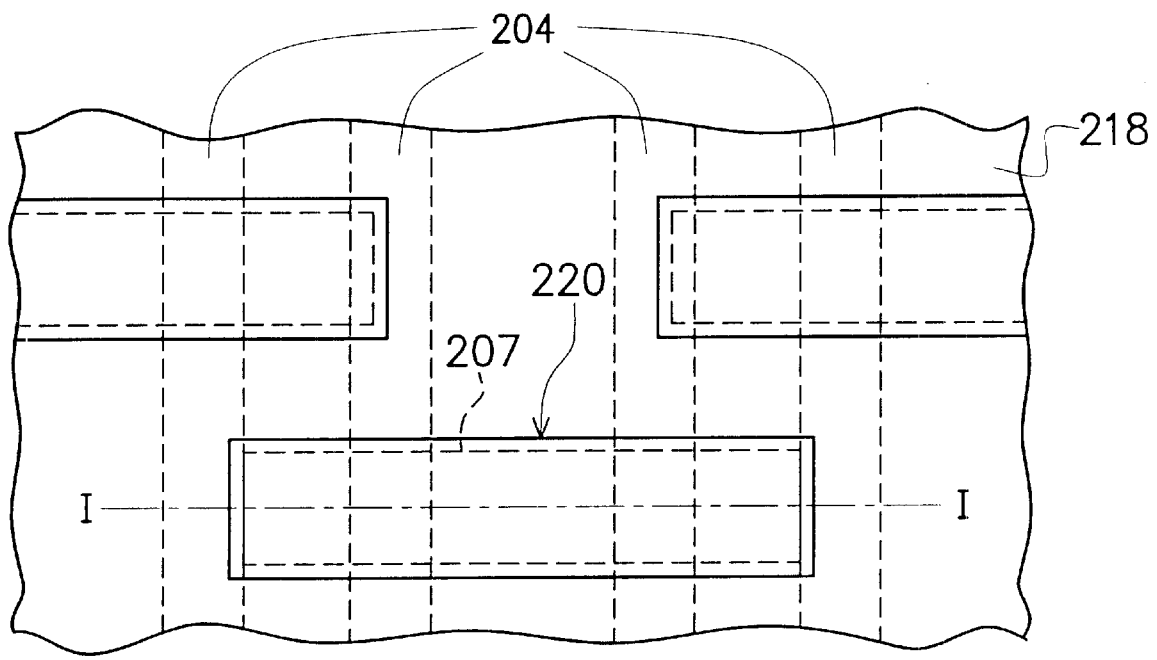

As shown in FIGS. 1B and 2B, a liner layer 215 is formed over the substrate 200. The liner layer can be a silicon nitride layer formed, for example, by chemical vapor deposition. An inter-layer dielectric layer 216 is formed over the substrate 200. A patterned photoresist layer 218 is formed over the inter-layer dielectric layer 216. The inter-layer dielectric layer 216 has a material composition different from the liner layer 215 so that each has a different etching rate. The inter-layer dielectric layer 216 can be a silicon oxide, a phosphosilicate glass or borophosphosilicate glass formed, for example, by chemical vapor deposition. The patterned photoresist layer 218 exposes the inter-layer dielectric layer 216 within the active region 207. Using the patterned photoresist layer 218 as an etching mask, a portion of the inter-layer dielectric layer 216 is removed to form an opening 220 above the active region 207. The opening 220 occupies an area slightly greater than the active region 207.

Figure 1C:
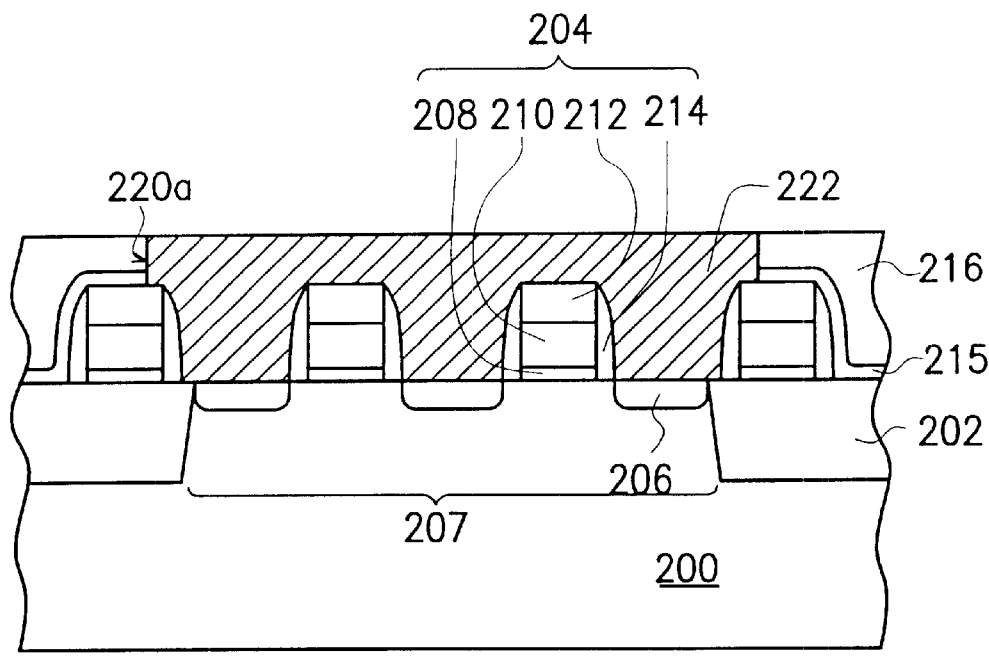
Figure 2C:
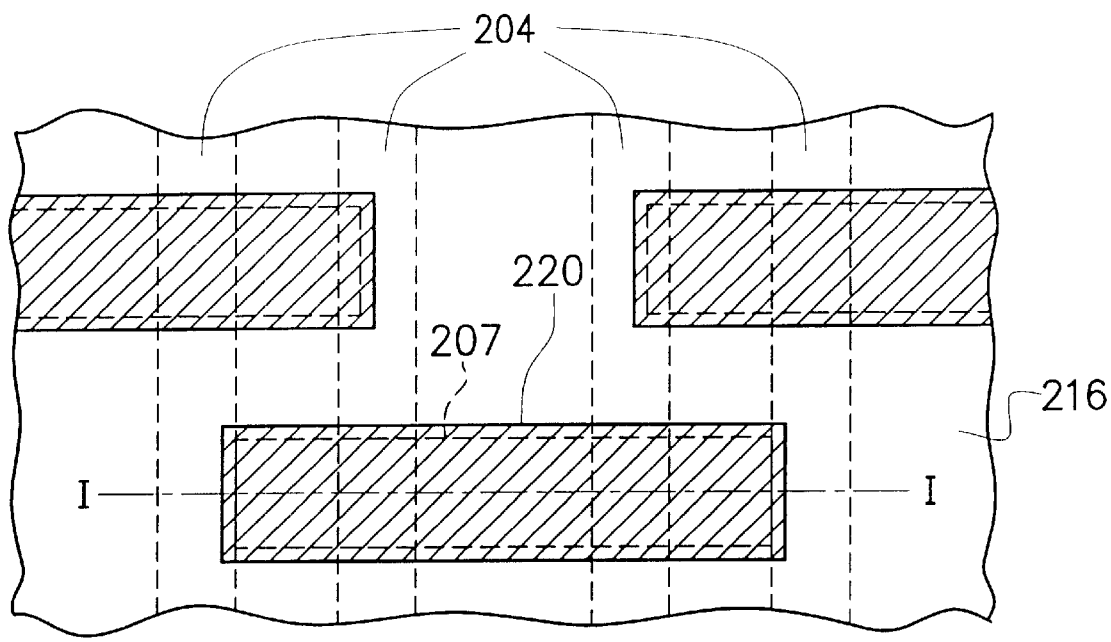

As shown in FIGS. 1C and 2C, the exposed liner layer 215 within the opening 220 is removed to form an opening 220a that exposes the source/drain regions 206 inside the active region 207. The patterned photoresist layer 218 is removed. A conductive layer 222 is formed over the substrate 200. The conductive layer 222 fills the opening 220a completely. The conductive layer 222 is formed, for example, by depositing polysilicon material over the substrate 200 in a chemical vapor deposition to form a polysilicon layer. This is followed by removing the excess polysilicon material outside the opening 220a in a back etching or chemical-mechanical polishing operation to expose the inter-layer dielectric layer 216.

Figure 1D:
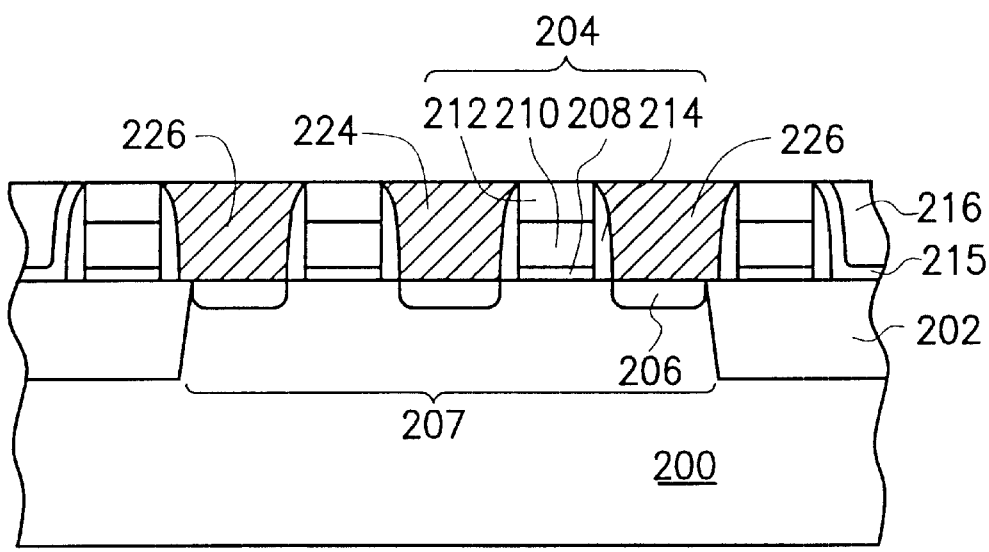
Figure 2D:
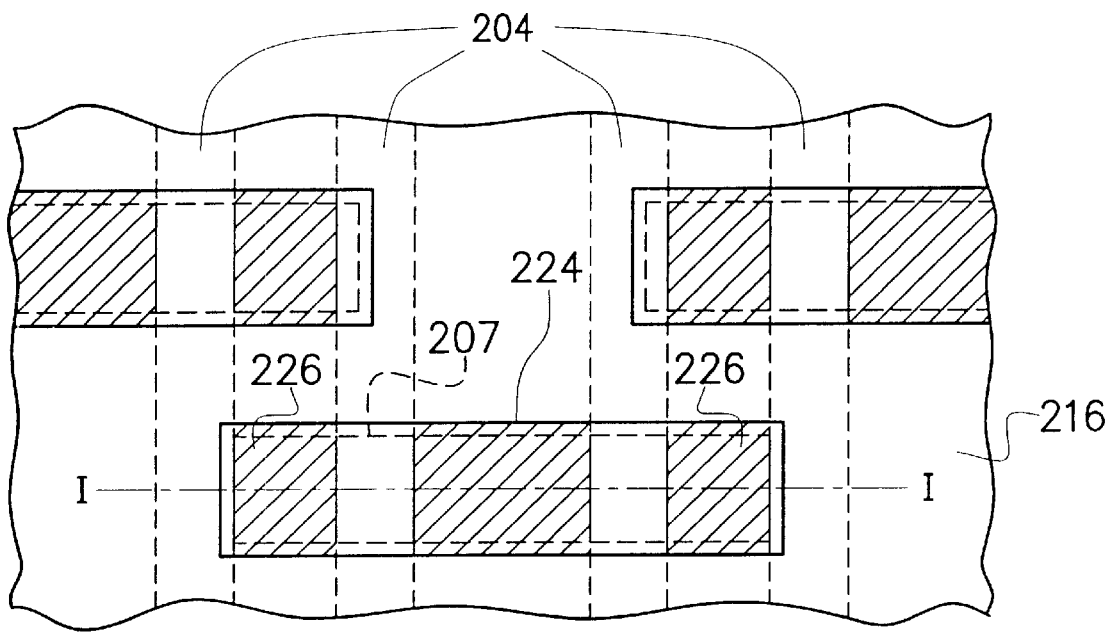

As shown in FIGS. 1D and 2D, a portion of the conductive layer 222, the inter-dielectric layer 216 and the liner layer 215 are removed to expose the upper surface of the gate structure 204. Hence, a bit line contact (landing pad) 224 and a storage node contact (landing pad) 226 are formed. Both the bit line contact 224 and the storage node contact 226 are at almost the same level as the gate structure 204. This prevents any possible short circuit due to a subsequent electrical connection between the bit line contact 224 and the storage node contact 226. The conductive layer 222, the inter-layer dielectric layer 216 and the liner layer 215 are removed, for example, by chemical-mechanical polishing using the gate cap layer 212 as an etching stop layer.

Figure 1E:
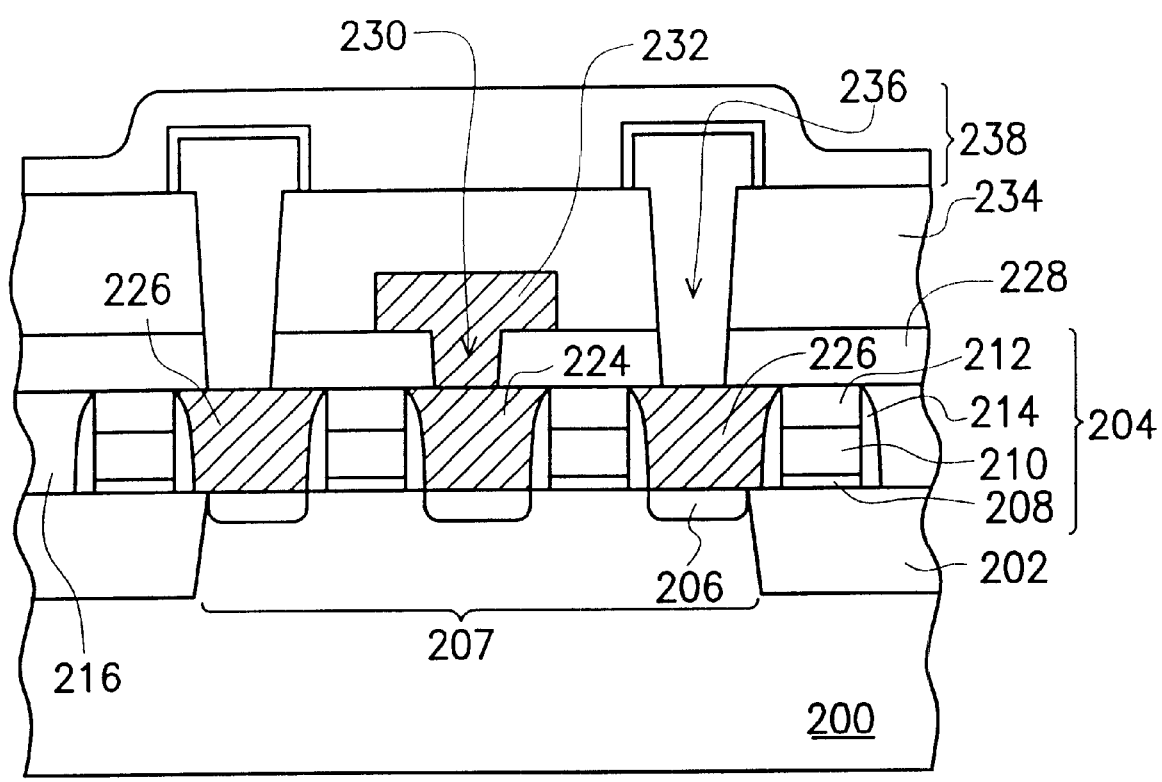

As shown in FIG. 1E, another inter-layer dielectric layer 228 is formed over the substrate 220. An opening 230 is formed over the bit line contact (landing pad) 224. Conductive material is deposited into the opening 230 to form a bit line 232. Yet another inter-layer dielectric layer 234 is formed over the inter-layer dielectric layer 228 and the bit line 232. An opening 236 that passes through the inter-layer dielectric layer 234 and the inter-layer dielectric layer 228 is formed over the storage node contact (landing pad) 226. Conductive material is deposited into the opening 236. A capacitor 238 having electrical connection with the storage node contact (landing pad) 226 is formed over the substrate 200. Thereafter, other steps for forming the remaining parts of the DRAM is carried out. Since these steps are familiar to the skilled technologists, detailed description is omitted here.

In the process of fabricating a DRAM according to this invention, a big opening is directly formed inside the inter-layer dielectric layer. The big opening is formed above the active region. Thereafter, the exposed liner layer inside the opening is removed to expose the source/drain regions between the gate structures. Conductive material is next deposited into the opening. Excess conductive material above the gate structure and a portion of the inter-layer dielectric layer and the liner layer are removed by conducting chemical-mechanical polishing using the gate cap layer as an etching stop. Ultimately, bit line contacts (landing pads) and the storage node contacts (landing pads) are formed. Since bit line contact openings and storage node openings each having a different dimension need not be separately formed inside the interlayer dielectric layer, performance stability and processing window for the semiconductor devices is improved and production cost is lowered. Furthermore, precise and reliable self-aligned contact openings are formed without any damages to the gate cap layer or the spacers and short circuit between the gate and subsequently formed bit line contacts or storage node contacts is greatly minimized.

In addition, a liner layer having a different etching rate from the inter-layer dielectric layer is formed over the substrate before the inter-layer dielectric layer. This liner layer serves as an etching stop layer when the inter-layer dielectric layer is etched to form the opening and protects the substrate or the gate structure against any damage due to etching. In this embodiment, the liner layer is a silicon nitride layer. Obviously, other material may be used to form the liner layer as long as the material has a different etching rate relative to the inter-layer dielectric layer.

If the gate cap layer and the spacers are formed using a material having a different etching rate from the inter-layer dielectric layer (for example: the gate cap layer and the spacers are silicon nitride layers while the inter-layer dielectric layer is a silicon oxide layer), there is no need to form the liner layer. The openings that expose the source/drain regions are immediately formed in the inter-layer dielectric layer without any intermediate processes. Furthermore, the bit line contacts and the storage node contacts fabricated according to this invention have a larger alignment and etching tolerance, greater stability and a lower production cost.

In the aforementioned embodiment, the fabrication of a DRAM device is illustrated. However, the method according to this invention can be applied to the fabrication of other memory devices. In addition, although a rectangular global opening is formed, opening having other shapes and size may be used.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a memory device, comprising the steps of:

providing a substrate having an active region thereon, wherein the active region includes a plurality of gate structures and a plurality of source/drain regions;

forming a liner layer, for covering the gate structures and the source/drain regions;

forming an inter-layer dielectric layer over the liner layer, wherein an etching rate of the liner layer is different from that of the inter-layer dielectric layer;

etching the inter-layer dielectric layer until a portion of the liner layer is exposed to form a global opening in the inter-layer dielectric layer;

etching the liner layer until the source/drain regions are exposed;

forming a conductive layer over the substrate that complete fills the global opening; and removing a portion of the conductive layer and the inter-layer dielectric layer to form contacts that connect electrically with the source/drain regions.

2. The method of claim 1, wherein material constituting the liner layer includes silicon nitride.

3. The method of claim 1, wherein material constituting the inter-layer dielectric layer is selected from a group consisting of silicon oxide, phosphosilicate glass and borophosphosilicate glass.

4. The method of claim 1, wherein the step of removing a portion of the conductive layer and the inter-layer dielectric layer includes chemical-mechanical polishing.

5. The method of claim 1, wherein the global opening at least exposes two different contact regions.

6. A method of manufacturing dynamic random access memory, comprising the steps of:
- providing a substrate having an active region thereon, wherein the active region further includes a plurality of gate structures and a plurality of source/drain regions;
- forming a liner layer, for covering the gate structures and the source/drain regions;
- forming an inter-layer dielectric layer over the liner layer, wherein an etching rate of the liner layer is different from that of the inter-layer dielectric layer;
- patterning the inter-layer dielectric layer until a portion of the liner layer is exposed to form a global opening;
- etching the liner layer until the source/drain regions are exposed;
- forming a conductive layer over the substrate, wherein the conductive layer completely fills the global opening;
- removing a portion of the conductive layer and the inter-layer dielectric layer to form a first contact and a second contact between the gate structures;
- forming a bit line on the substrate electrically connected to the first contact; and
- forming a capacitor on the substrate electrically connected to the second contact.

7. The method of claim 6, wherein the gate structure includes a gate dielectric layer, a gate conductive layer, spacers and a gate cap layer.

8. The method of claim 7, wherein the gate cap layer and the spacers have an etching rate different from the inter-layer dielectric layer.

9. The method of claim 8, wherein material constituting the gate cap layer includes silicon nitride.

10. The method of claim 8, wherein material constituting the gate cap layer includes silicon oxynitride.

11. The method of claim 8, wherein material constituting the spacer includes silicon nitride.

12. The method of claim 8, wherein material constituting the spacer includes silicon oxynitride.

13. The method of claim 6, wherein material constituting the inter-layer dielectric layer is selected from a group consisting of silicon oxide, phosphosilicate glass and borophosphosilicate glass.

14. The method of claim 6, wherein the global opening at least exposes two different contact regions.

15. The method of claim 6, wherein the step of removing a portion of the conductive layer and the inter-layer dielectric layer includes chemical-mechanical polishing.

16. The method of claim 6, wherein material constituting the liner layer includes silicon nitride.

* * * * *